United States Patent
Mardilovich et al.

(10) Patent No.: US 7,265,063 B2
(45) Date of Patent: Sep. 4, 2007

(54) METHOD OF FORMING A COMPONENT HAVING DIELECTRIC SUB-LAYERS

(75) Inventors: Peter Mardilovich, Corvallis, OR (US); Laura Kramer, Corvallis, OR (US); Gregory S Herman, Albany, OR (US); Randy Hoffman, Corvallis, OR (US); David Punsalan, Eugene, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 10/971,337

(22) Filed: Oct. 22, 2004

(65) Prior Publication Data
US 2006/0086976 A1    Apr. 27, 2006

(51) Int. Cl.
H01L 27/28 (2006.01)
H01L 21/312 (2006.01)
H01L 21/47 (2006.01)

(52) U.S. Cl. .................. 438/781; 438/82; 438/780
(58) Field of Classification Search ............ 438/82, 438/99, 780, 781
See application file for complete search history.

(56) References Cited

U.S. PATENT DOCUMENTS

| 5,399,604 | A |   | 3/1995 | Sano et al. |
| 5,530,036 | A |   | 6/1996 | Sano et al. |
| 5,796,708 | A | * | 8/1998 | Ohkawa et al. ............. 369/283 |
| 6,021,564 | A | * | 2/2000 | Hanson ........................ 29/852 |
| 6,693,697 | B2 |   | 2/2004 | Sakamoto et al. |
| 6,696,105 | B2 |   | 2/2004 | Hiroki et al. |
| 7,098,525 | B2 | * | 8/2006 | Bai et al. ..................... 257/642 |
| 2002/0089615 | A1 |   | 7/2002 | Sakamoto et al. |
| 2004/0076839 | A1 | * | 4/2004 | Egitto et al. ................ 428/448 |
| 2004/0082163 | A1 | * | 4/2004 | Mori et al. ................. 438/630 |

FOREIGN PATENT DOCUMENTS

EP    1295924    3/2003

OTHER PUBLICATIONS

International Search Report and Written Opinion of the International Searching Authority dated Aug. 2, 2006.

* cited by examiner

Primary Examiner—Zandra V. Smith
Assistant Examiner—Pamela E Perkins

(57) ABSTRACT

Embodiments of methods, apparatuses, devices, and/or systems for forming a component having dielectric sub-layers are described.

33 Claims, 4 Drawing Sheets

METHOD OF FORMING A COMPONENT HAVING DIELECTRIC SUB-LAYERS

BACKGROUND

Electronic devices, such as integrated circuits, smart packages and electronic displays, for example, may comprise one or more components, such as one or more thin film transistors (TFTs). Methods and/or materials utilized to form components and/or devices such as these may vary, and one or more of these methods and/or materials may have particular disadvantages. For example, use of such methods and/or materials may be time-consuming and/or expensive, may preclude the use of particular materials, and/or may not produce devices and/or components having the desired characteristics.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

Figure 1:
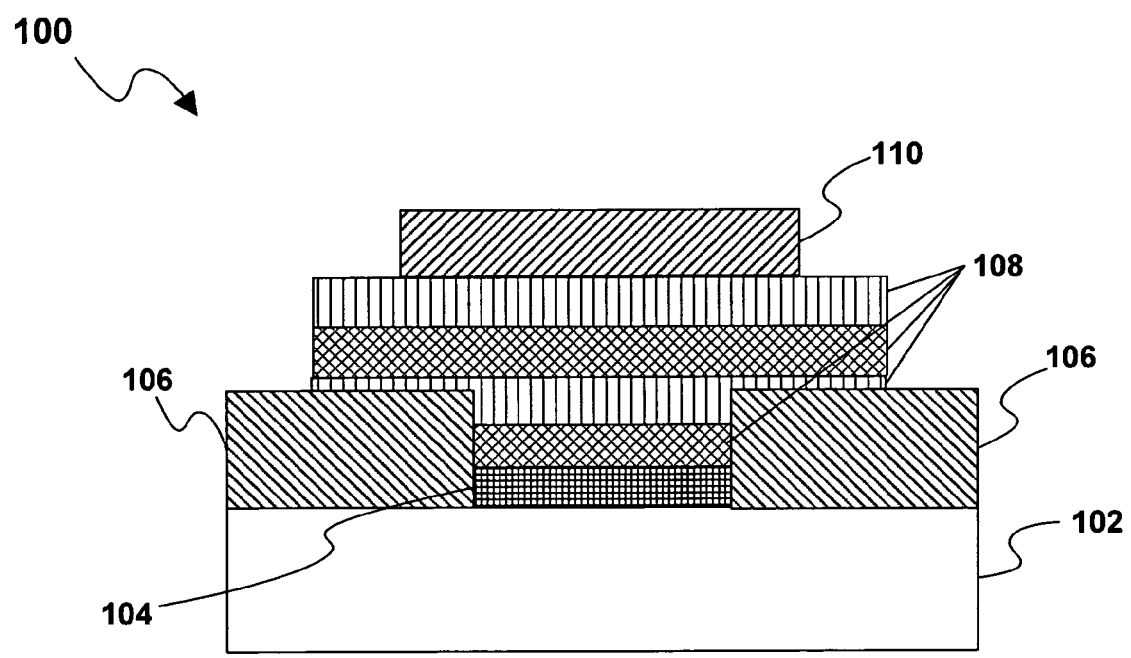
FIG. 1 is a cross sectional view of one embodiment of a TFT.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and/or dielectric devices, for example, may comprise one or more electronic components. The one or more electronic components may comprise one or more thin film components, for example, which may be comprised of one or more thin films. In this context, the term thin film refers to a layer of one or more materials formed to a thickness, such that surface properties of the one or more materials may be observed, and these properties may vary from bulk material properties. Thin films may additionally be referred to as component layers, and one or more component layers may comprise one or more layers of material, which may be referred to as material layers, for example. The one or more material and/or component layers may have electrical and/or chemical properties, such as conductivity, chemical interface properties, charge flow, and/or processability, for example. The one or more material and/or component layers may additionally be patterned, for example. The one or more material and/or component layers, in combination with one or more other material and/or component layers may form one or more electrical components, such as thin film transistors (TFTs), capacitors, diodes, resistors, photovoltaic cells, insulators, conductors, optically active components, or the like. Components such as TFTs, in particular, may, for example, be utilized in components including smart packages and/or display devices including, for example, radio-frequency identification (RFID) tags, electroluminescent and liquid crystal displays (LCD), such as active matrix liquid crystal display (AMLCD) devices, including a backplane of an AMLCD, for example.

At least as part of the fabrication process of electronic components such as thin film components, including, for example, thin film transistors, one or more layers of material may be formed at least as part of one or more of the component layers, such as by forming a dielectric layer as part of a thin film transistor. In at least one embodiment, the dielectric layer may be comprised of multiple material layers, which may additionally be referred to as sub-layers, for example. In this embodiment, as at least a part of the fabrication process, one or more material layers and/or sub-layers may be formed by use of one or more formation processes and by use of one or more materials, such as a combination of materials, for example, and additional material layers and/or sub-layers may be formed by use of one or more formation processes and by use of one or more materials, and these processes and materials may vary, for example. In one particular embodiment, at least a portion of a component, such as a thin film component, may be formed by use of one or more processes, at least one of which may be referred to as solution processing, for example. Solution processing, as used in this context, comprises one or more processes, wherein a solution, such as a substantially liquid solution, and/or a solid or solid precursor that may be at least partially dissolved in a liquid, for example, may be deposited on one or more surfaces of a device and/or a component layer, such as on one or more surfaces of a substrate, by use of one or more deposition processes. Components, such as electronic components, including TFTs, for example, which may be at least partially formed by one or more processes such as solution processes may be referred to as solution processed components, for example. In one embodiment of solution processing, an ejection mechanism, such as an ink jet device and/or a spray nozzle, may deposit and/or jet one or more materials onto a surface, in order to substantially form a material layer, for example. Additionally, one or more spin coating processes and/or one or more contact printing processes, wherein one or more printing devices may be capable of printing materials, such as liquid materials, on to a surface, may be utilized in one or more embodiments of solution processing, although these are just a few examples, and claimed subject matter is not so limited. For example, one or more dip coating processes, one or more curtain coating, screen printing, and chemical bath deposition processes may be utilized in one or more embodiments of solution processing, for example. Additionally, as used herein, an ejection device, such as a spray device and/or a jetting device, including an ink jet device, may comprise a mechanism capable of ejecting material such as a liquid material, and may eject material in the form of drops, for example, such as mechanically and/or electrically, and/or in response to electrical signals, and may be capable of ejecting material in controlled portions, in a controlled manner, and/or in a controlled direction, for example. Additionally, an ejection device may operate by use of one or more ejection schemes, including continuous ejection, piezo ejection, thermal ejection, acoustic ejection and/or flex tensioned ejection, for example, but, again, claimed subject matter is not limited to these examples.

Although claimed subject matter is not so limited, in one particular embodiment, an electronic component, such as a thin film component, may comprise at least one component layer, wherein the at least one component layer comprises two or more sub-layers of material, wherein at least a portion of the sub-layers are modified after deposition, such as by sub-curing of at least a portion of the material and/or removing at least a portion of the material, such as by evaporation of at least a portion of a solvent, such as if the material deposited at least partially comprises a solvent, for example. It is worthwhile to note that here and throughout the description, modification of a material, such as after deposition, may refer generally to modification such as by removing at least a portion of the material by evaporation, for example, and/or altering one or more physical, chemical, and/or electrical properties, such as by sub-curing. Sub-curing, when used in this context, refers generally to a process wherein a at least a portion of a layer of material, including a material layer, a sub-layer and/or a component layer may be at least partially transformed into a substantially solid film, such as a liquid precursor being sub-cured to form an oxide film or polymeric film, and may comprise one or more solvent and/or organic group removal processes, and/or one or more decomposition processes of metal organic compounds and/or or metal alkoxides, and or derivatives thereof. Sub-curing, in this manner, may result from heating, for example, such as thermal, laser, microwave and/or other types of radiative heating. Additionally, one or more portions of one or more materials may be altered by sub-curing, and may be at least partially solidified, crystallized, polymerized, patterned, and/or having the density altered, but, again, particular processing performed on the one or more materials may be selected based at least in part on the material(s) utilized to form the material layer, for example, and/or the particular component being formed, for example. Additionally, while sub-curing may be performed on one or more material layers, material sub-layers and/or component layers of a component, such as after deposition of a material layer as described above, final curing may be performed on a component formed from one or more component layers, for example. In this context, final curing refers generally to one or more curing processes performed on a component, such as thermal curing and/or UV curing, wherein multiple component layers of the component are cured, such as part of a final processing step, explained in more detail later.

In this embodiment, a component layer may comprise two or more sub-layers of material, such as three, four, five and/or six sub-layers of material, for example, wherein at least a portion of the sub-layers of material may be substantially similar, and may be formed by depositing a material and subsequently modifying the material, such as by sub-curing, and then performing the depositing and/or modifying for additional sub-layers, for example, although claimed subject matter is not so limited. In this embodiment, the component layer may comprise a dielectric layer, wherein the dielectric layer may be comprised of one or more sub-layers, for example. The dielectric layer, in this embodiment, may be formed by use of multiple deposition and/or modification processes, for example, and may be formed by substantially repeating a deposition process and/or a modification process one or more times, whereby a dielectric layer comprising multiple sub-layers is formed, wherein at least a portion of the sub-layers may comprise substantially the same material, and/or may be deposited by substantially similar processes, and wherein at least a portion of the sub-layers are modified, such as by sub-curing, prior to the deposition of subsequent sub-layers, for example. This may result, for example, in a dielectric layer and/or the resultant component having particular properties, such as desirable dielectric performance, desirable planarization of one or more layers, desired uniformity, desirable interface characteristics, such as the top interface, including desired wetting and adhesion, explained in more detail later, desired porosity, desired integrity, desired current leakage and breakdown voltages, and/or additional physical, chemical and/or electrical properties, and may additionally have reduced defect density as compared to a dielectric layer not formed in this manner. However, claimed subject matter is not limited to these particular properties, and one or more of these properties may be explained in more detail later, such as with reference to FIG. 3, below.

Referring now to FIG. 1, there is illustrated a cross-sectional view of one embodiment 100 of an electronic component in a stage of formation. Electronic component 100, here, may comprise an electronic component formed by use of one or more processes and/or materials, such as multiple processes to form a single component layer, for example, and may comprise a portion of a display device, such as a portion of an active-matrix liquid crystal display (AMLCD) device, such as a backplane, a portion of a smart package, such as an RFID tag, as just a few examples Embodiment 100, here, comprises substrate 102, with one or more component layers 104, 106, 108 and/or 110 formed thereon. In one particular embodiment, component layer 104 may comprise a channel layer, component layer 106 may comprise an electrode layer, and may further comprise a drain and/or source electrode, for example; component layer 110 may comprise a gate electrode layer; and component layer 108, which may comprise multiple material sub-layers, as illustrated, may comprise a dielectric layer. Although illustrated as having four sub-layers, claimed subject matter is not limited to four sub-layers, and may comprise greater and/or fewer than four sub-layers, for example. In this particular configuration, however, component 100 may be referred to as a top gate thin film transistor, which may refer to a transistor configured to have a gate electrode layer formed on or over a dielectric layer, for example, although it is worthwhile to note that this is just one embodiment, and claimed subject matter is not limited in this respect, but may comprise other configurations such as a bottom gate transistor, as explained in more detail in reference to FIG. 2. Additionally, it is noted, here and throughout this description that claimed subject matter is not limited to the foregoing material and/or material layers, sub-layers and/or component layers being formed on one another. For example, other layers and/or sub-layers may be included, such as intervening layers and/or sub-layers formed between various layers and/or sub-layers, so that layers and/or sub-layers may be formed above or over one another rather than on one another, depending, for example, on the particular embodiment.

Figure 2:
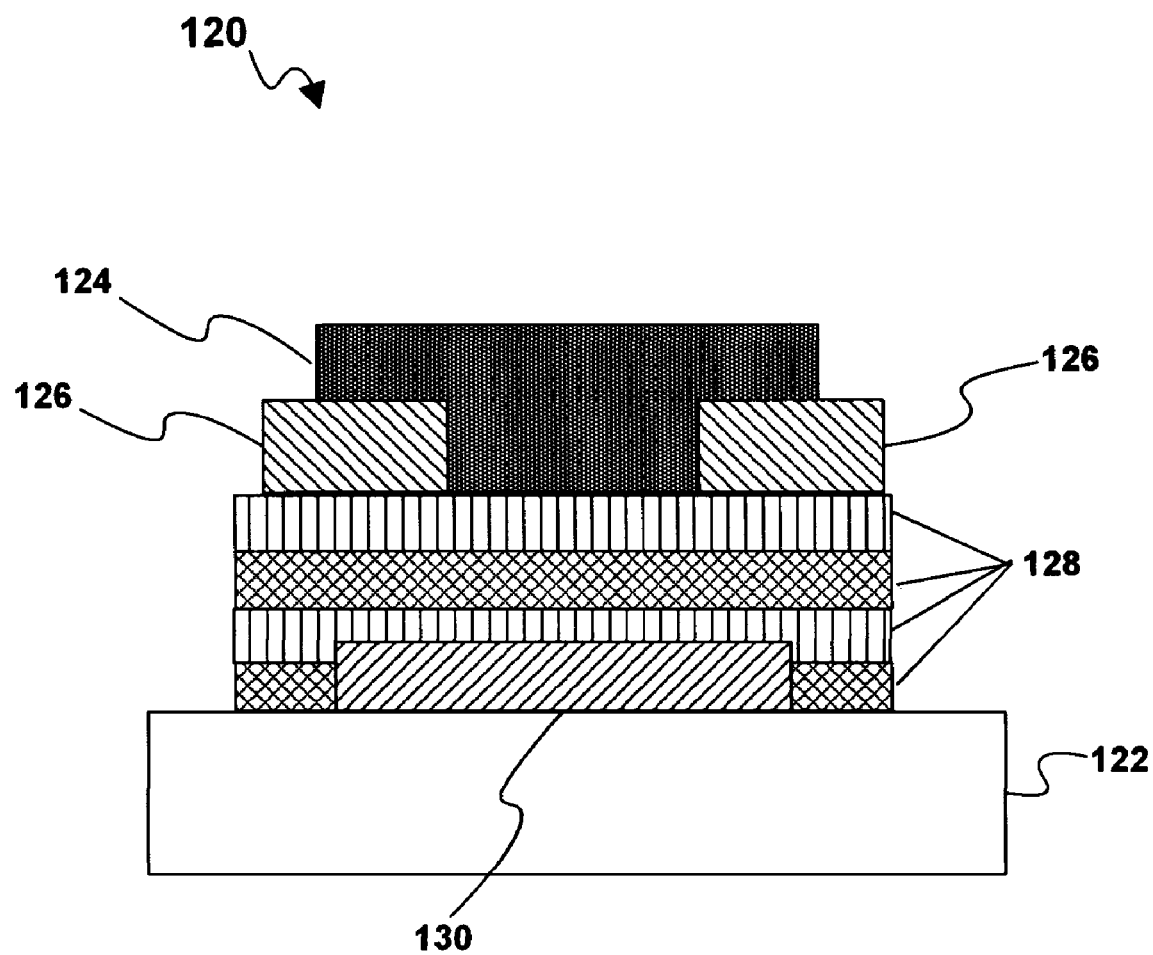
FIG. 2 is a cross sectional view of one embodiment of a TFT.

Referring now to FIG. 2, there is illustrated a cross-sectional view of one embodiment 120 of an electronic component in a stage of formation. Electronic component 120, similar to embodiment 100, may comprise an electronic component formed by use of one or more processes and/or materials, such as multiple processes to form a single component layer, for example, and may comprise a portion of a display device, such as a portion of an AMLCD device, as just a few examples. Embodiment 120, here, comprises substrate 122, with one or more component layers 124, 126, 128 and/or 130 formed thereon. In one particular embodiment, component layer 124 may comprise a channel layer, component layer 126 may comprise an electrode layer, and may further comprise a drain and/or source electrode, for example; component layer 128, which may comprise multiple material sub-layers, as illustrated, may comprise a dielectric layer; and component layer 130 may comprise a gate electrode layer, and, in this particular configuration, component 120 may be referred to as a bottom gate thin film transistor, which may refer to a transistor configured to have a gate electrode layer formed on or over a substrate, and a dielectric layer formed over the gate electrode layer, for example. Additionally, similar to embodiment 100, it is noted that claimed subject matter is not limited to the foregoing material and/or material layers, sub-layers and/or component layers being formed on one another. For example, other layers and/or sub-layers may be included, such as intervening layers and/or sub-layers formed between various layers and/or sub-layers, so that layers and/or sub-layers may be formed above or over one another rather than on one another, depending, for example, on the particular embodiment.

Although claimed subject matter is not limited to any particular material and/or combination of materials to form one or more of the layers, sub-layers and/or components illustrated in FIGS. 1 and/or 2, in at least one embodiment, one or more of the component layers may comprise one or more of the materials described below. Additionally, it is worthwhile to note that claimed subject matter is not limited in this respect, and one or more of the component layers may comprise any material or combination of materials, such materials that may be suitable for use as one or more component layers, including materials exhibiting properties suitable for application by one or more solution processes and/or suitable for one or more curing processes. For example, in this embodiment, where component layers 102 and/or 122 comprise substrate layers, component layers 102 and/or 122 may comprise one or more materials suitable for use as a substrate, including, for example, silicon, silicon dioxide, one or more types of glass, one or more organic substrate materials, such as polyimides (PI), including Kapton®, polyethylene terephthalates (PET), polyethersulfones (PES), polyetherimides (PEI), polycarbonates (PC), polyethylenenaphthalates (PEN), acrylics including polymethylmethacrylates (PMMA) and combinations thereof, stainless steel and/or metal foils, including foils of aluminum and/or copper, for example, but claimed subject matter is not so limited. Additionally, in at least one embodiment, wherein a substrate material is substantially comprised of one or more metals, an insulator layer may be utilized in addition to the one or more metals, for example. Additionally, in this particular embodiment, component layers 104 and/or 124 may comprise channel layers. Component layers 104 and/or 124 may be comprised of one or more materials suitable for use as a channel layer, including, for example, metal oxides such as zinc oxide, tin oxide, indium oxide, gallium oxide, cadmium oxide, lead oxide, copper oxide, silver oxide and combinations thereof; silicon, including amorphous, nanowire, microribbon, and/or polycrystalline silicon; carbon nanotubes, GaAs, Ge, CdS, CdSe, ZnS, ZnSe, $SnS_2$, $SnSe_2$, and combinations thereof, for example. In this embodiment, wherein component layers 106 and/or 126 comprise electrode layers, and may be comprised of one or more source and/or drain electrodes, for example, at least a portion of component layers 106 and/or 126 may be substantially comprised of indium tin oxide; other doped oxide semiconductors, such as n-type doped zinc oxide, indium oxide, and/or tin oxide, and/or metals, such as Al, Ag, In, Sn, Zn, Ti, Mo, Au, Pd, Pt, Cu, W, Ni and combinations thereof, as just a few examples. Additionally, in this embodiment, wherein component layers 110 and/or 130 comprise gate electrode layers, component layers 110 and/or 130 may be comprised of metals, such as Al, Ag, In, Sn, Zn, Ti, Mo, Au, Pd, Pt, Cu, Ni; doped oxide semiconductors, such as n-type doped zinc oxide, indium oxide, tin oxide and combinations thereof, as just a few examples.

Additionally, component layers 108 and/or 128 may comprise dielectric layers, and may be formed from a plurality of material sub-layers, for example. In one embodiment, component layers 108 and/or 128 may comprise one or more organic materials, such as described previously. In at least one embodiment, the dielectric layers 108 and/or 128 may be comprised of a plurality of material sub-layers, wherein the material layers may be substantially similar, and/or wherein the material layers may be modified, such as by sub-curing, prior to the deposition of subsequent layers, for example. In at least one embodiment, one or more organic dielectric materials may comprise acrylic monomer, curable monomer, such as UV curable monomer and/or UV curable acrylic monomer, and combinations thereof, for example. Additionally, one or more organic dielectric materials may be substantially comprised of UV curable acrylic polymer, acrylic polymer, thermal curable monomer, one or more types of glass, including solution processed glass, one or more glass resins including silsesquioxanes, polymer solution, including melted polymer and/or oligomer solution, poly methyl methacrylate, poly vinylphenol, benzocyclobutene, one or more polyimides and combinations thereof, as just a few examples. However, formation of one or more of the material and/or component layers of embodiments 100 and/or 120 may be better understood in reference to FIG. 4, later.

Figure 3A:
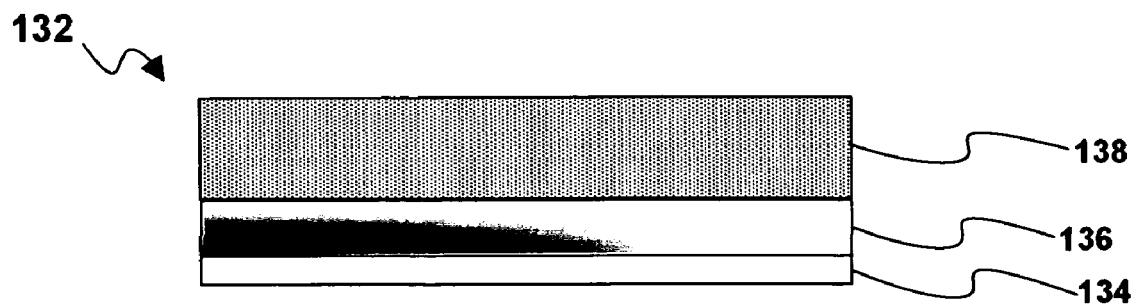
FIG. 3 is an illustration of one or more properties of one embodiment of a component.
Figure 3B:
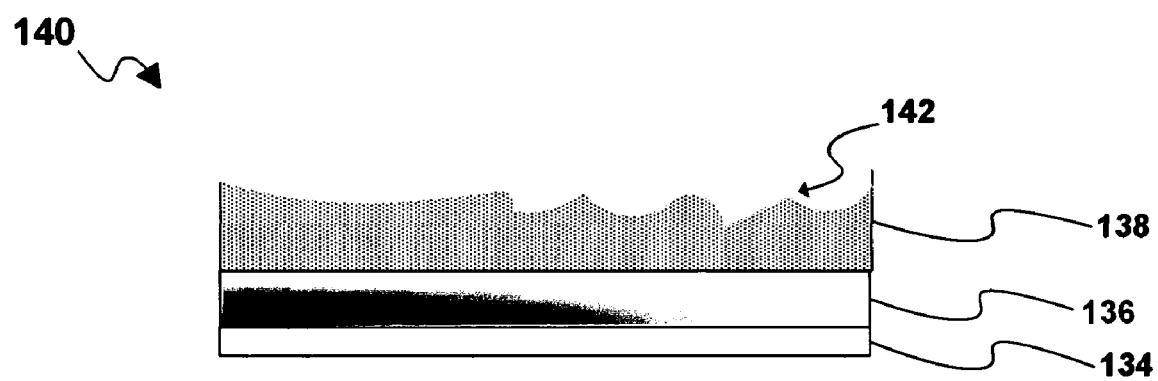
Figure 3C:
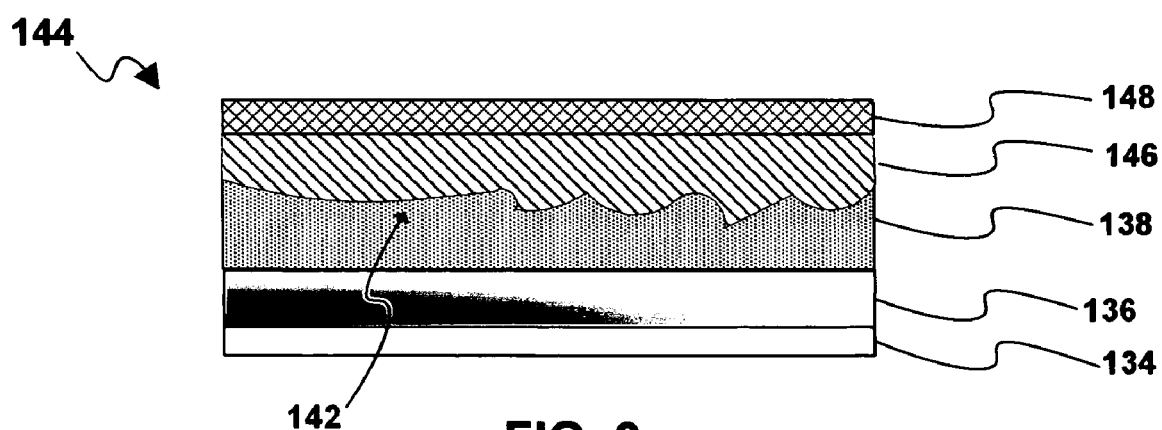

As alluded to previously, and as will be explained in more detail hereinafter, use of one or more of the aforementioned processes and/or materials may result in the production of a component and/or device having desirable characteristics. For example, a component formed to have a dielectric layer, wherein the dielectric layer is formed from a plurality of material sub-layers, and wherein at least a portion of the material layers are modified, such as by sub-curing, prior to the deposition of subsequent layers may result in the formation of a component having desirable physical, chemical and/or electrical properties, such as desirable dielectric performance, desirable planarization of one or more layers, desired uniformity, desirable interface characteristics, such as the top interface, including desired wetting and adhesion, desired porosity, desired integrity, desired level of current leakage and breakdown field, and/or reduced defect density, as just a few examples, although claimed subject matter is not so limited. Illustrated in FIGS. 3a-3c illustrates one or more desirable characteristics that may result from use of one or more of the aforementioned processes and/or materials, for example. Illustrated in FIG. 3a is a partially formed thin film component 132. Partially formed thin film component 132 may comprise, for example, a portion of the TFT, including a portion of a display device, such as a backplane, a portion of a smart package, such as an RFID tag, a portion of a capacitor, and/or a portion of one or more electronic components, such as an encapsulation layer portion, a passivation layer portion, and/or an interlayer dielectric portion of one or more of the aforementioned electronic components and/or devices, although claimed subject matter is not so limited, and component 132 is primarily for illustrative purposes. As shown in FIG. 3a, component 132 may comprise a substrate 134, and a material layer 136 that may have a varying density, illustrated by the varying contrast of the layer. Alternatively, although not illustrated, component 132 may have a substrate with a varying density, such as if the substrate material is at least partially porous, and, in this example, there may not be a material layer 136 formed thereon. However, in this embodiment, material layer 136 may have a varying density, such as if the material used to form layer 136 is porous, as just an example, and, although not illustrated in detail, in at least one embodiment, layer 136 may comprise a gate electrode, channel layer, and/or source and drain electrodes, for example. Component 132 also includes material layer 138, which may comprise at least a portion of a dielectric layer, as just an example, although the particular component layers may depend on the particular component and/or component configuration being illustrated, such as a top gate and/or bottom gate TFT, although, again, component 132 is primarily for illustrative purposes. Shown in FIG. 3b is a component 140, which may comprise component 132, such as after a portion of material layer 138 may be wicked, absorbed and/or otherwise may migrate into at least a portion of layer 136, such as if layer 136 is porous or is capable of absorbing a portion of material layer 138, resulting in the top surface 142 of layer 138 not being planar, as illustrated. Additionally, after deposition of layer 136, the resultant top surface may not be planar, such as due to the particular material and/or deposition process utilized to form layer 136, for example, and the subsequent deposition of layer 138 may result in the formation of a non-planar top surface 142, for example. The resultant configuration illustrated in FIG. 3b may result, for example, from selection of particular materials and/or processes to deposit the particular materials, and may result in undesired properties, such as by producing a component having high defect density, reduced planarization, reduced adhesion, and/or less control over the resultant dimensions of a component, such as component 140. For example, a material may be deposited onto substrate 134 and/or material layer 136, and at least a portion of the material may be absorbed by substrate 134 and/or material layer 136, and/or may be wicked into substrate 134 and/or material layer 136, for example, and the resultant top surface of material layer 138 may be affected, for example.

As illustrated in FIG. 3c, deposition of a material layer, such as layer 146 on to at least a portion of component 140 may produce component 144, and may reduce and/or eliminate these undesired characteristics of component 140, such as by planarizing the resultant stack of material layers and/or filling in one or more voids and/or holes, as just an example. This may provide a resultant component 144 having a surface that may be more planar than if material layer 146 is not deposited, for example, and may provide that subsequent layers, such as layer 148, may be planar, and the top surface of component 144 may be planar, even though one or more material layers may not be planar, for example. However, it is noted here and throughout this description that claimed subject matter is not so limited, and these particular characteristics are used for illustrative purposes only, and particular materials utilized in one or more embodiments may not necessarily exhibit one or more of these characteristics.

Formation of one or more layers of component 100 of FIG. 1 and/or component 122 of FIG. 2, as well as one or more other components and/or portions described previously, including a portion of a capacitor, and/or a portion of one or more electronic components, such as an encapsulation layer portion, a passivation layer portion, and/or an interlayer dielectric portion of one or more of the aforementioned electronic components and/or devices, may comprise one or more processes, and/or numerous process operations, but claimed subject matter is not limited to any particular method of formation of one or more portions of component 100. However, in at least one embodiment, one or more solution processes may be utilized, such as one or more of the following: one or more ejection processes, including, for example, one or more ink jet processes, including one or more thermal ink jet processes and one or more spraying processes including spray coating, one or more contact printing processes, one or more spin coating, dip coating, curtain coating, screen printing and chemical bath deposition processes as just a few examples, but again, claimed subject matter is not so limited. Particular methods of formation of the devices illustrated herein may be better understood when explained with reference to FIG. 4, below.

Additionally, components such as described previously including components as illustrated in FIGS. 1 and/or 2 may be formed by use of a computer controlled formation system (not shown), which may be capable of providing material and/or modifying the material, such as by curing, including sub-curing and final curing, whereby one or more portions of a component are formed. A formation system used to form one or more of the illustrated components may, for example, comprise a deposition device (not shown), capable of disposing material on or over one or more layers. In at least one embodiment, a deposition device may comprise an ejection device, which may comprise a jetting device and/or a spraying device, and may be configured to apply material, such as conductive, nonconductive and/or dielectric material to locations on or over a component, whereby one or more portions of component 100 are formed, for example. As used herein, conductive, when used, such as with conductive component layers, generally refers to the capability to at least partially conduct electricity, and may comprise a structure that is conductive, semiconductive, and/or partially conductive, such as a structure exhibiting one or more conductive properties, for example. Additionally, a formation system may comprise a modification device, such as a UV curing device and/or a laser device. In one embodiment, a laser device may be capable of generating a laser beam at a frequency in the electromagnetic spectrum and having suitable energy to provide intense localized or "spot" heating, for example (not shown), although this is just one example, and claimed subject matter is not limited in this respect. However, particular methods of formation of the components illustrated herein may be better understood when explained with reference to FIG. 4, below.

Figure 4:
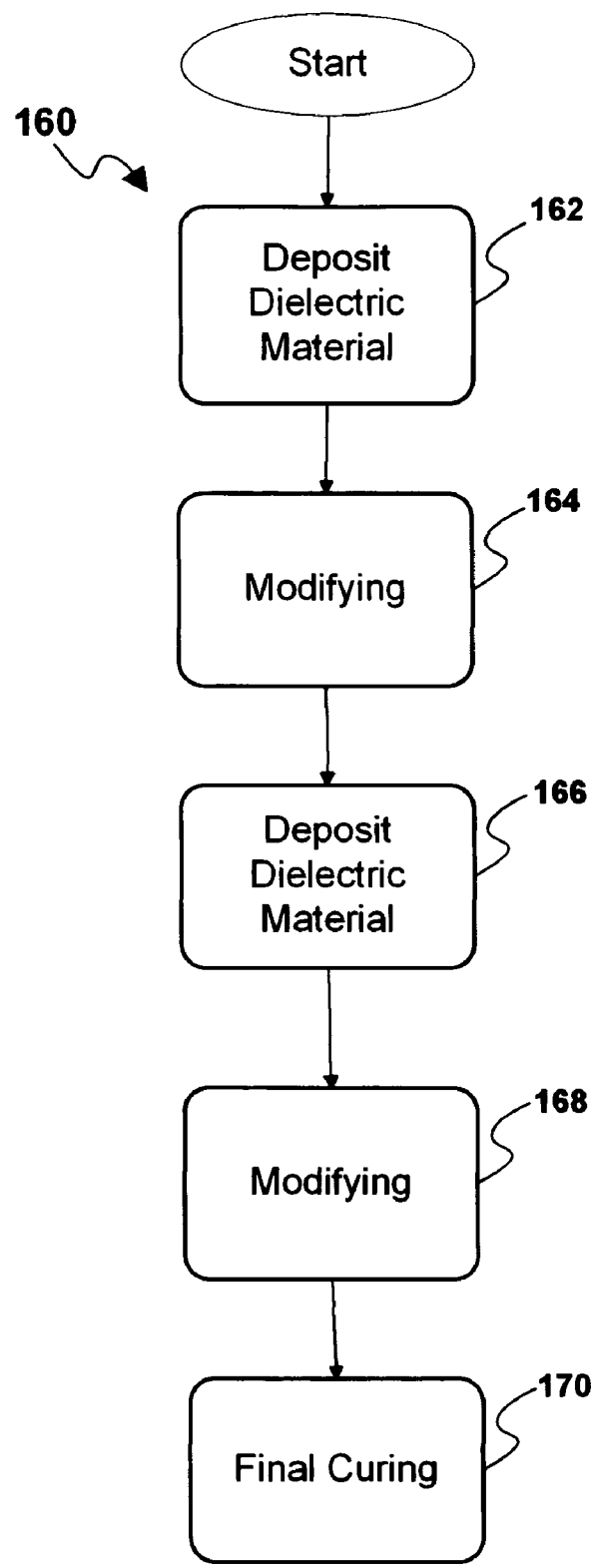
FIG. 4 is a flowchart illustrating one embodiment of a method to form a component.

Referring now to FIG. 4, one embodiment of a technique for forming a transistor having a multiple sub-layer dielectric is illustrated by a flowchart, although claimed subject matter is not limited in scope in this respect. Such an embodiment may be employed to at least partially form a component at least in part, such as component 100 of FIG. 1 and/or component 120 of FIG. 2, a portion of a capacitor, and/or a portion of one or more electronic components, such as an encapsulation layer portion, a passivation layer portion, and/or an interlayer dielectric portion of one or more of the aforementioned electronic components and/or devices, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter. Flowchart 160 depicted in FIG. 4 may, in alternative embodiments, be at least partially implemented in hardware, or a combination of hardware with software and/or firmware, such as the aforementioned computer controlled formation system, and may comprise discrete and/or continual operations. In this embodiment, at block 162, one or more dielectric materials may be deposited on or over one or more layers of a component, such as a partially formed component, such as illustrated in FIGS. 1 and/or 2, for example, such as on or over at least a portion of a substrate layer, a channel layer, and/or an electrode layer, as just a few examples. At block 164, at least a portion of the deposited dielectric material may be modified, and modification may comprise sub-curing and/or removing at least a portion of the material, such as by evaporation and/or drying, for example, explained in more detail later. At block 166, one or more additional dielectric materials may be deposited on or over one or more layers of a component, such as one or more of the aforementioned portions, and, in one embodiment, the additional dielectric material may be formed at least partially on the dielectric material deposited previously, for example. At block 168, at least a portion of the deposited dielectric material may be modified, such as by sub-curing and/or removing at least a portion of the material. At block 170, at least a portion of one or more materials and/or portions of the component may be final cured, such as by annealing and/or UV curing, for example. However, it is worthwhile to note that selection of particular deposition, modification and/or curing processes may depend at least in part on the particular material or combination of materials utilized to form the one or more material sub-layers, for example, as explained in more detail hereinafter.

In this embodiment, at block 162, one or more dielectric materials may be deposited on or over at least a portion of a component, such as on one or more layers of a multilayer component, including, for example, a substrate layer, a channel layer, and/or an electrode layer, as just a few examples. As illustrated in FIG. 1, one or more organic dielectric materials may be deposited such that at least a portion of a dielectric layer, such as a sub-layer, of dielectric layer 108, is formed. In this embodiment, one or more organic dielectric materials, such as UV curable monomer, UV curable acrylic polymer, thermal curable monomer, polymer solution, including melted polymer and/or oligomer solution, poly methyl methacrylate, poly vinylphenol, benzocyclobutene, one or more polyimides and combinations thereof may be formed on or over at least a portion of one or more component layers, such as at least a portion of a substrate layer, a channel layer, and/or an electrode layer, although claimed subject matter is not limited in this respect. Deposition of one or more organic materials may comprise one or more solution processes, including, for example, one or more ejection processes, such as one or more jetting processes, including thermal, continuous and/or piezo jetting, such as by use of an ink jet device, including a thermal ink jet (TIJ) device, for example. Additionally, one or more other solution processes, such as one or more contact printing processes and/or one or more coating processes, such as one or more spin coating processes may be utilized to deposit at least a portion of the material, for example. Although numerous materials or combinations of materials may be utilized to form a sub-layer of organic material, the material(s) utilized may depend, at least in part, on the particular process(es) utilized, for example. Additionally, the one or more materials deposited may be in one or more forms, such as in a substantially liquid form, in a nanoparticle suspension form, and/or one or more types of precursor forms, as just a few examples. Additionally, the material(s) deposited may be deposited to a thickness, although the particular thickness may depend at least in part on one or more factors, such as the material(s) utilized to form the one or more sub-layers, the number of sub-layers being formed, and/or the particular component being formed, for example.

In this embodiment, at block 164, at least a portion of the one or more materials deposited at block 162 may be modified, such as by sub-curing and/or removing at least a portion of the material, although, in alternative embodiments, no modification may be performed, for example. Additionally, particular modification performed on the one or more materials may be selected based at least in part on the material(s) utilized to form the material sub-layer, for example, and/or the particular component being formed, for example. In one embodiment, at least a portion of the one or more organic materials may be at least partially sub-cured, which may comprise curing at least a portion of a material layer and/or material sub-layer, such as by UV and/or thermal curing, for example. Alternatively, at least a portion of one or more organic materials may be at least partially removed, such as by removing at least a portion of a solvent by evaporation, for example. Additionally, one or more physical, chemical and/or electrical modifications may be made to the one or more materials in at least one embodiment, including solidification, ablation, crystallization, polymerization, densification, and/or patterning, but, again, particular modification performed on the one or more materials may be selected based at least in part on the material(s) utilized to form the material sub-layer, for example, and/or the particular component being formed, for example.

In this embodiment, at block 166, one or more additional dielectric materials may be deposited on or over at least a portion of a component, such as a substrate layer, a channel layer, an electrode layer and/or a dielectric sub-layer, such as formed at block 162, as just a few examples. As illustrated in FIG. 1, one or more organic dielectric materials may be deposited such that an additional portion of a dielectric layer, such as a sub-layer of a dielectric layer, such as dielectric layer 108, is formed. In this embodiment, the material deposited may be substantially similar to the material deposited at block 162, for example, although claimed subject matter is not so limited. For example, one or more organic dielectric materials, such as described with reference to block 162, for example, may be formed on or over at least a portion of one or more component layers. Additionally, deposition of one or more organic materials may comprise one or more solution processes, such as one or more of the processes described in reference to block 162, for example. Additionally, the one or more materials deposited may be in one or more forms, and/or may be deposited to a thickness, although the particular material form and/or thickness of deposition may depend at least in part on one or more factors, such as the material(s) utilized to form the one or more sub-layers, the number of sub-layers being formed, and/or the particular component being formed, for example.

In this embodiment, at block 168, at least a portion of the one or more materials deposited at block 166 may be modified, such as by sub-curing and/or removing at least a portion of the material, although, in alternative embodiments, no modification may be performed, for example. Additionally, particular modification performed on the one or more materials may be selected based at least in part on the material(s) utilized to form the material sub-layers, for example, and/or the particular component being formed, for example. In one embodiment, at least a portion of the one or more organic materials may be at least partially sub-cured, which may comprise curing at least a portion of a material layer and/or material sub-layer, such as by UV and/or thermal curing, such as described previously, for example. Alternatively, at least a portion of one or more organic materials may be at least partially removed, such as by removing at least a portion of a solvent by evaporation, for example. Additionally, one or more physical, chemical and/or electrical modifications may be made to the one or more materials in at least one embodiment, but, again, particular modification performed on the one or more materials may be selected based at least in part on the material(s) utilized to form the material sub-layer, for example, and/or the particular component being formed, for example.

In this embodiment, at block 170, at least a portion of one or more material layers, such as one or more dielectric sub-layers, and/or one or more layers not described in detail, including channel layers, electrode layers and/or substrate layers may undergo a final cure, for example. This may comprise, for example, final curing the formed component, such as by UV and/or thermal curing, for example. In at least one embodiment, final curing of the component may provide desirable physical, chemical, and/or electrical properties that a component not subjected to a final cure may not possess, for example, although claimed subject matter is not so limited. For example, the final cure may have varying intensity, such as laser or UV intensity, may be longer in duration, and/or may be performed at a varying pressure as compared to a sub-curing UV process, for example, although claimed subject matter is not limited in this respect.

As alluded to previously, formation of a component such as a thin film transistor wherein the transistor comprises a multiple sub-layer dielectric layer may result in the formation of a transistor having particular characteristics that may vary from a component not being formed in this manner and/or from this particular combination of materials. For example, a dielectric layer of a thin film transistor may be formed in this manner, and may result in the formation of a thin film transistor having desirable characteristics, such as by having desirable physical, chemical and/or electrical properties, such as desirable dielectric performance, desirable planarization of one or more layers, desired uniformity, desirable interface characteristics, such as the top interface, including desired wetting and adhesion, desired porosity, desired integrity, desired level of current leakage and breakdown field, and/or reduced defect density, as just a few examples, although claimed subject matter is not so limited. Thus, formation of a transistor in accordance with one or more of the aforementioned embodiments, wherein the transistor comprises a dielectric layer comprised of a multiple sub-layers of substantially organic material may result in the formation of a component, such as a thin film component, having desirable characteristics, such as characteristics not exhibited by a component not formed to have a dielectric layer with multiple material layers, as just an example.

It is now appreciated, based at least in part on the foregoing disclosure, that a combination of hardware and software and/or firmware may be produced capable of performing a variety of operations, including one or more of the foregoing operations, which may be implemented in a system suitable for forming a transistor having a multiple sub-layer dielectric, as described previously. It will additionally be understood that, although particular embodiments have just been described, claimed subject matter is not limited in scope to a particular embodiment or implementation. For example, a system capable of implementing one or more of the foregoing operations described in reference to FIG. 4 may comprise hardware, such as implemented to operate on a device or combination of devices as previously described, for example, whereas another embodiment may be in software and hardware, for example. Likewise, an embodiment of a system capable of implementing one or more of the abovementioned operations may be implemented in firmware, or as any combination of hardware, software, and/or firmware, for example. Additionally, all or a portion of one embodiment may be implemented to operate at least partially in one device, such as an ejection device, a laser device, a display, a computing device, a set top box, a cell phone, and/or a personal digital assistant (PDA), for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone, and/or a personal digital assistant (PDA), and/or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method, comprising:
    depositing a first material over at least a portion of a substrate utilizing one or more solution processes to form a first dielectric sub-layer, wherein said first dielectric sub-layer substantially comprises organic dielectric material;
    modifying at least a portion of said first dielectric sub-layer;
    depositing a second material over and in contact with said first dielectric sub-layer utilizing one or more solution processes to form a second dielectric sub-layer, wherein said second dielectric sub-layer substantially comprises organic dielectric material;
    modifying at least a portion of the second dielectric sub-layer;
    forming a channel layer over at least a portion of the substrate;
    forming a source and drain electrode over at least a portion of the substrate; and
    forming a gate electrode over at least a portion of the substrate to form at least a portion of a gate thin film transistor, wherein said channel layer is formed on said substrate, said source and drain electrodes are formed on at least a portion of at least one of said substrate and said channel layer, said first dielectric sub-layer is formed on at least a portion of at least one of said channel layer and said source and drain electrodes, and said second dielectric sub-layer is formed on at least a portion of said first dielectric sub-layer.

2. The method of claim 1, and further comprising:
depositing a third material over and/or in contact with said second dielectric sub-layer utilizing one or more solution processes to form a third dielectric sub-layer, wherein said third dielectric sub-layer substantially comprises organic dielectric material; and
modifying at least a portion of the third dielectric sub-layer, to form at least a portion of a thin film device.

3. The method of claim 2, and further comprising:
depositing a fourth material over and/or in contact with said third dielectric sub-layer utilizing one or more solution processes to form a fourth dielectric sub-layer, wherein said fourth dielectric sub-layer substantially comprises organic dielectric material; and
modifying at least a portion of the forth dielectric sub-layer, to form at least a portion of a thin film device.

4. The method of claim 1, and further comprising: final curing the first and second dielectric sub-layer and/or the substrate by a single curing process after the second dielectric sub-layer is substantially modified.

5. The method of claim 4, wherein said final curing substantially comprises one or more of: UV curing and thermal curing.

6. The method of claim 1, wherein said modifying substantially comprises sub-curing.

7. The method of claim 6, wherein said sub-curing substantially comprises one or more of: UV curing and thermal curing.

8. The method of claim 1, wherein said modifying substantially comprises one or more of: evaporation, solidification, ablation, crystallization, removal, polymerization, densification, and patterning.

9. The method of claim 1, wherein said one or more solution processes comprises one or more of the following: ejection, contact printing, and dip coating.

10. The method of claim 9, wherein said ejection process is substantially performed by a thermal ink jet (TIJ) device.

11. The method of claim 1, wherein said first and said second material substantially comprise one or more of: monomers, including UV curable monomers, UV curable acrylic monomers, acrylic monomers and thermal curable monomers, acrylic polymers, polymer solutions, melted polymers, oligomer solutions, poly methyl methacrylates, polyimides, poly vinylphenols, benzocyclobutenes, and combinations thereof.

12. The method of claim 1, wherein said first dielectric sub-layer and said second dielectric sub-layer substantially comprise UV curable acrylic monomer, and wherein said modifying substantially comprises UV curing at least a portion of said first and said second dielectric sub-layers.

13. The method of claim 1, and further comprising:
where forming the gate electrode over at least a portion of the substrate includes forming the gate electrode on at least a portion of said second dielectric sub-layer such as to form at least a portion of a top gate thin film transistor.

14. A method, comprising:
a step for forming a first dielectric sub-layer over a substrate, wherein said first dielectric sub-layer substantially comprises organic dielectric material;
a step for sub-curing at least a portion of said first dielectric sub-layer;
a step for forming a second dielectric sub-layer over and in contact with at least a portion of said first dielectric sub-layer, wherein said second dielectric sub-layer substantially comprises organic dielectric material;
a step for sub-curing at least a portion of said second dielectric sub-layer;
forming a channel layer over at least a portion of the substrate;
forming a source and drain electrode over at least a portion of the substrate; and
forming a gate electrode over at least a portion of the substrate to form at least a portion of a gate thin film transistor, wherein said channel layer is formed on said substrate, said source and drain electrodes are formed on at least a portion of at least one of said substrate and said channel layer, said first dielectric sub-layer is formed on at least a portion of at least one of said channel layer and said source and drain electrodes, and said second dielectric sub-layer is formed on at least a portion of said first dielectric sub-layer.

15. The method of claim 14, wherein said sub-curing further comprises UV curing and/or thermal curing.

16. The method of claim 14, wherein said steps for forming said first and said second dielectric sub-layers substantially comprise one or more solution processes.

17. The method of claim 16, wherein said one or more solution processes comprises one or more of the following: ejection, contact printing, and dip coating.

18. The method of claim 17, wherein said ejection process is substantially performed by a thermal ink jet (TIJ) device.

19. The method of claim 14, wherein said organic dielectric material substantially comprises one or more of: monomers, including UV curable monomers, UV curable acrylic monomers, acrylic monomers and thermal curable monomers, acrylic polymer, polymer solution, melted polymer, oligomer solutions, poly methyl methacrylates, polyimides, poly vinylphenols, benzocyclobutenes, and combinations thereof.

20. The method of claim 19, wherein said first dielectric sub-layer and said second dielectric sub-layer substantially comprise UV curable acrylic monomer, and wherein said modifying substantially comprises UV curing at least a portion of said first and said second dielectric sub-layers.

21. A method, comprising:
depositing a first material over at least a portion of a substrate utilizing one or more solution processes to form a first dielectric sub-layer, wherein said first dielectric sub-layer substantially comprises organic dielectric material;
modifying at least a portion of said first dielectric sub-layer;
depositing a second material over and in contact with said first dielectric sub-layer utilizing one or more solution processes to form a second dielectric sub-layer, wherein said second dielectric sub-layer substantially comprises organic dielectric material;
modifying at least a portion of the second dielectric sub-layer, such as to form at least a portion of an electronic component having multiple organic dielectric sub-layers;
forming a channel layer over at least a portion of the substrate;
forming a source and drain electrode over at least a portion of the substrate; and
forming a gate electrode over at least a portion of the substrate, wherein said gate electrode is formed on said substrate, said first dielectric sub-layer is formed on at least a portion of at least one of said gate electrode and said substrate, said second dielectric sub-layer is formed on at least a portion of said first dielectric sub-layer to form at least a portion of a gate thin film transistor.

22. The method of claim 21, where forming the gate electrode further includes forming said source and drain electrodes on at least a portion of said second dielectric sub-layer; and forming said channel layer on at least a portion of at least one of said second dielectric sub-layer and said source and drain electrodes, such as to form at least a portion of a bottom gate thin film transistor.

23. The method of claim 21, and further comprising:
depositing a third material over and/or in contact with said second dielectric sub-layer utilizing one or more solution processes to form a third dielectric sub-layer, wherein said third dielectric sub-layer substantially comprises organic dielectric material; and modifying at least a portion of the third dielectric sub-layer, to form at least a portion of the gate thin film transistors.

24. The method of claim 23, and further comprising:
depositing a fourth material over and/or in contact with said third dielectric sub-layer utilizing one or more solution processes to form a fourth dielectric sub-layer, wherein said fourth dielectric sub-layer substantially comprises organic dielectric material; and modifying at least a portion of the forth dielectric sub-layer, to form at least a portion of the gate thin film transistor.

25. The method of claim 21, and further comprising: final curing the first and second dielectric sub-layer and/or the substrate by a single curing process after the second dielectric sub-layer is substantially modified.

26. The method of claim 25, wherein said final curing substantially comprises one or more of: UV curing and thermal curing.

27. The method of claim 21, wherein said modifying substantially comprises sub-curing.

28. The method of claim 27, wherein said sub-curing substantially comprises one or more of: UV curing and thermal curing.

29. The method of claim 21, wherein said modifying substantially comprises one or more of: evaporation, solidification, ablation, crystallization, removal, polymerization, densification, and patterning.

30. The method of claim 21, wherein said one or more solution processes comprises one or more of the following: ejection, contact printing, and dip coating.

31. The method of claim 30, wherein said ejection process is substantially performed by a thermal ink jet (TIJ) device.

32. The method of claim 21, wherein said first and said second material substantially comprise one or more of: monomers, including UV curable monomers, UV curable acrylic monomers, acrylic monomers and thermal curable monomers, acrylic polymers, polymer solutions, melted polymers, oligomer solutions, poly methyl methacrylates, polyimides, poly vinylphenols, benzocyclobutenes, and combinations thereof.

33. The method of claim 21, wherein said first dielectric sub-layer and said second dielectric sub-layer substantially comprise UV curable acrylic monomer, and wherein said modifying substantially comprises UV curing at least a portion of said first and said second dielectric sub-layers.

* * * * *

UNITED STATES PATENT AND TRADEMARK OFFICE
CERTIFICATE OF CORRECTION

PATENT NO. : 7,265,063 B2 Page 1 of 1
APPLICATION NO. : 10/971337
DATED : September 4, 2007
INVENTOR(S) : Peter Mardilovich et al.

It is certified that error appears in the above-identified patent and that said Letters Patent is hereby corrected as shown below:

In column 15, line 22, in Claim 23, delete "transistors" and insert -- transistor --, therefor.

Signed and Sealed this

Eighteenth Day of November, 2008

JON W. DUDAS
*Director of the United States Patent and Trademark Office*